(12) United States Patent
Myers et al.

(10) Patent No.: US 6,185,127 B1
(45) Date of Patent: Feb. 6, 2001

(54) SELECTABLE ANALOG FUNCTIONS ON A CONFIGURABLE DEVICE AND METHOD EMPLOYING NONVOLATILE MEMORY

(75) Inventors: Theodore M. Myers, Los Altos; Richard A. Palm, Boulder Creek; Richard V. Orlando, Los Gatos; Kenneth C. Adkins, Fremont, all of CA (US)

(73) Assignee: Summit Microelectronics, Inc., Campbell, CA (US)

( * ) Notice: Under 35 U.S.C. 154(b), the term of this patent shall be extended for 0 days.

(21) Appl. No.: 09/495,409

(22) Filed: Jan. 31, 2000

(51) Int. Cl.⁷ ..................................................... G11C 16/04
(52) U.S. Cl. ......................................... 365/185.03; 365/45
(58) Field of Search .................................. 365/185.03, 45

(56) References Cited

U.S. PATENT DOCUMENTS 5,764,560 * 9/1998 Lee et al. .......................... 365/185.03
5,838,610 * 11/1998 Hashimoto ....................... 365/185.03
5,844,841 * 12/1998 Takeuchi et al. ................. 365/185.03
6,011,715 * 1/2000 Pasotti et al. ..................... 365/185.03

* cited by examiner

Primary Examiner—Son T. Dinh
(74) Attorney, Agent, or Firm—Fernendez & Associates, LLP

(57) ABSTRACT

A configurable integrated circuit and method for trimming a desirable combination of analog and digital functions and customizing pin assignments by programming nonvolatile memory. Functional enhancement and chip compatibility are achieved by configuring an integrated circuit with specified analog and digital settings for operation with an external chip. Multiple NV registers with designated bits that correspond to activating, deactivating, trimming, or changing analog functions including internal voltages, bandgap, and oscillating frequencies.

20 Claims, 8 Drawing Sheets

Byte 0

| Bits 6-5 | Reset timout | Bits 4-0 | Reset range |
|---|---|---|---|
| 11 | 200ms | 10000 | 4.625 |
| 10 | 100ms | 01000 | 4.375 |
| 01 | 50ms | 00100 | 2.9 |
| 00 | 25ms | 00010 | 2.65 |
|  |  | 00001 | 2.15 |

FIG. 3A

Byte 1

| Bit 6 | Complete config write disable | Bit 5 | Vsense overvoltage/ undervoltage | Bit 4 | Responds to all addresses |
|---|---|---|---|---|---|
| 1 | Write disable | 1 | Undervoltage | 1 | Respond to all addresses |
| 0 | Write enable | 0 | Overvoltage | 0 | Respond to pin addresses |

| Bit 3 | Change device identifier code | Bit 2-0 | Watchdog interval |
|---|---|---|---|
| 1 | Respond to 1011 | 111 | 6.4s |
| 0 | Respond to 1010 | 110 | 3.2s |
| | | 101 | 1.6s |
| | | 100 | .8s |
| | | 011 | .4s |
| | | 00X | off |

FIG. 3B

Byte 2

| Bits 7-5 | Osc Trim | Bit 4 | Full Mem/ Half Mem | Bits 3-0 | Bandgap (Vsense) trim |
|---|---|---|---|---|---|
| 111 | Slower | 1 | 4K/16K | 1111 | Lower |
| 000 | Faster | 0 | 2K/8K | 0000 | Higher |

FIG. 3C

Byte 3

| Bits 7 | Config write disable | Bits 6-4 | Full Mem/ Half Mem | Bits 3-0 | Vtrip trim |
|---|---|---|---|---|---|
| 1 | Write disable | 111 | Part 8 | 1111 | Lower |
| 0 | Write enable | 110 | Part 7 | 0000 | Higher |
| | | 101 | Part 6 | | |
| | | 100 | Part 5 | | |
| | | 011 | Part 4 | | |
| | | 010 | Part 3 | | |
| | | 001 | Part 2 | | |
| | | 000 | Part 1 | | |

FIG. 3D

SELECTABLE ANALOG FUNCTIONS ON A CONFIGURABLE DEVICE AND METHOD EMPLOYING NONVOLATILE MEMORY

BACKGROUND OF THE INVENTION

1. Field of the Invention

The invention relates to the field of integrated circuit, and particularly to a configurable integrated circuit employing nonvolatile memory.

2. Description of Related Art

Power management integrated circuit market is growing rapidly for applications ranging from telecommunications, wireless devices, adaptive automotive systems, home appliances, to Internet security. Power management chips operate cooperatively with microprocessors for controlling various functions on a system. Consumer electronics, handheld devices, and desktop computers may require an integrated circuit to have different analog specifications and signal couplings with external chips.

Conventional power management chips provide outputs with digital values without analog output capabilities. For example, many analog functions require transistors to operate at a higher voltage than the typically 5 volts in a digital system. Other conventional power management chips provide separate integrated circuit device for each voltage level. More recently, manufacturers trim various internal reference voltages during wafer fabrication by burning fuses or via laser beams, which are limited to a one-time modification. None of these solutions are ideal due to their functional limitations and reduction in yield counts.

Accordingly, it is desirable to have a power management chip that provides an integrated circuit with configurable analog functions.

SUMMARY OF THE INVENTION

The invention discloses a configurable integrated circuit that enables a manufacturer or a customer to select the characteristics of analog functions and analog outputs for communication with external chips. The configurable integrated circuit employs nonvolatile (NV) memory with programmable bits including electrically erasable cells ($E^2$ cells), for customizing a specific circuit configuration. Activation or de-assertion of NV bits trims or selects analog functions including internal voltage thresholds, reset circuits, watchdog timers, voltage sensors, bandgap, and oscillating frequencies. NV bits also control a combination of analog circuits into digital outputs.

In an alternate embodiment, pin assignments on a configurable integrated circuit can be programmed through configuration registers. Pin assignments are directed to analog operations, such as programming pins to a no connect (electrically isolated), a watchdog timer reset input, and an active low drain output responding to a secondary voltage.

The use of NV registers provide the capability for programming multiple times in altering analog functions and settings. For example, a mother board can be assembled first in which a power management chip is programmed to with a set of analog functions and settings. The reverse is also applicable. A power management chip is first inserted on a mother board, where resistance and capacitance values can be adjusted or substituted to attain functional operation.

Optionally, the configurable integrated circuit contains actual analog circuits and functions that are selected by programming the nonvolatile memory, as opposed to a blank chip such as a blank ASIC. For example, the configurable integrated circuit is designed to include four power management channels. If one of the four power management channels is not used, the unused power management channel is disabled, while the other three power management channels are enabled.

Advantageously, the present invention reduces costs by trimming internal voltages during a final manufacturing test or board level test of an integrated circuit chip. The present invention also advantageously provides a fast turnaround time by changing analog functions in a device configuration by programming nonvolatile memory. Furthermore, the present invention allows a customer to qualify one part for use with different and customized application.

BRIEF DESCRIPTION OF THE DRAWINGS

FIGS. 3A–3D are table diagrams illustrating bit assignments for bytes 0 through 3 in con figuration registers in a configurable microprocessor supervisory device in accordance with the present invention.

DETAILED DESCRIPTION OF PREFERRED EMBODIMENT

Figure 1:
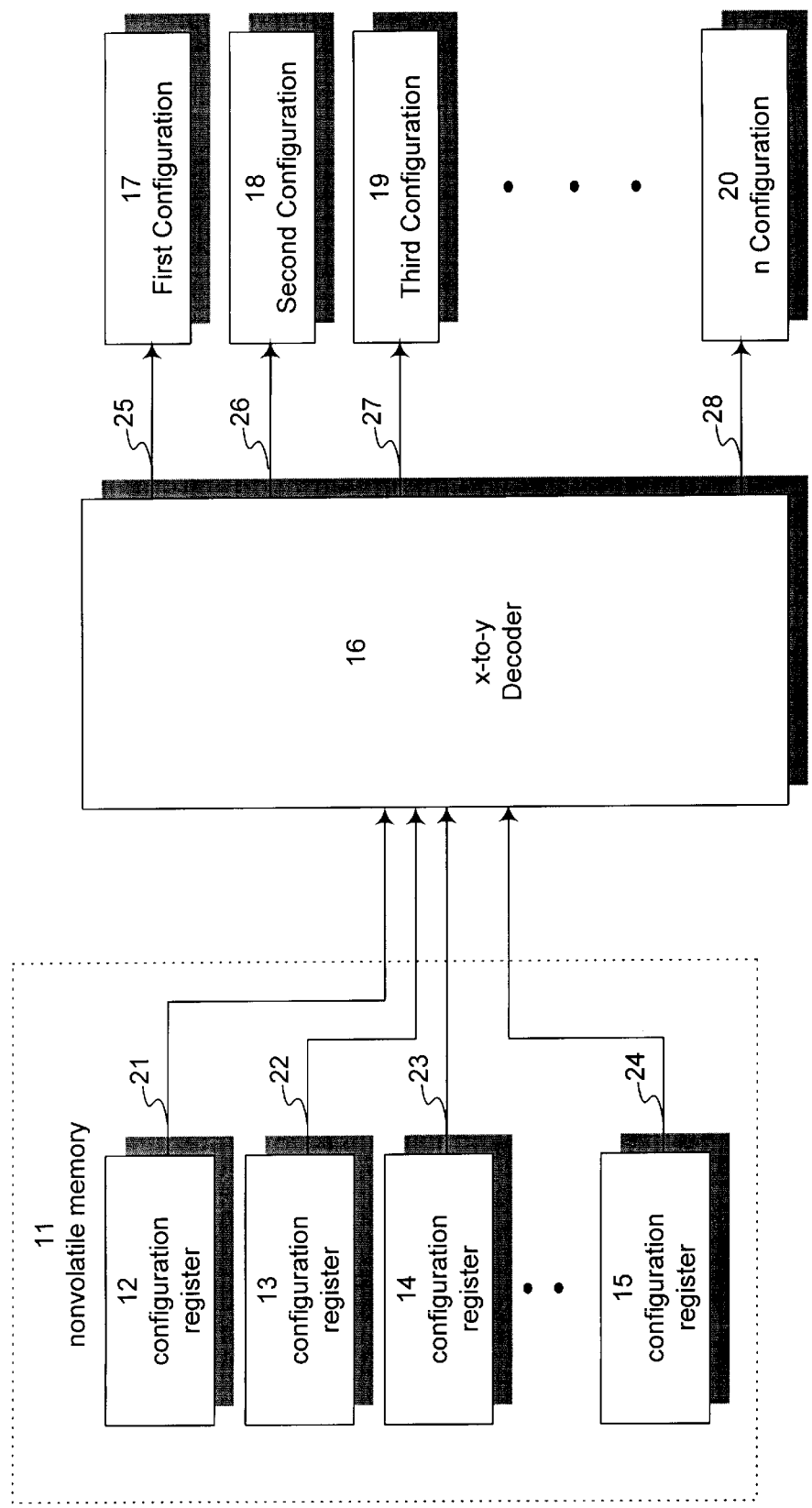
FIG. 1 is a block diagram illustrating a configurable microprocessor supervisory device with a nonvolatile memory in accordance with the present invention.

FIG. 1 is an architectural diagram of a configurable microprocessor supervisory device 10 which employs a nonvolatile (NV) memory 11. Configurable microprocessor supervisory device 10 includes NV memory 11 having configuration registers 12–15, an x-to-y decoder 16, a first configuration 17, a second configuration 18, a third configuration 19, and an n configuration 20. Configurable microprocessor supervisory device 10 provides a range of analog functions and output levels which are selectable by programming the bits in NV register 12, 13, 14, and 15. Decoder 16 decodes through a line 21 of programmable bits in configuration register 12, a line 22 of programmable bits in configuration register 13, a line 23 of programmable bits in configuration register 14, or a line 24 of programmable bits in configuration register 15. The result of decoding configuration registers 12–15 produces a device configuration as either first configuration 17 via a line 25, second configuration 18 via a line 26, third configuration 19 via a line 27, and n configuration 20 via a line 28.

A manufacturer or user initially determines a desirable set of analog functions in configurable microprocessor supervisory device 10. Configurable microprocessor supervisory device 10 then becomes one of the configurations as first configuration 16, second configuration 17, third configuration 18, or n configuration 19. The configuration in microprocessor supervisory device 10 is determined by the programmable bits in NV registers 13, 14, and 15. Each bit or a combination of bits in NV registers 13, 14, and 15 corresponds to activating or deactivating an analog function, or increasing or decreasing an activated analog function. Optionally, one skilled in the art should recognize that digital functions, or a combination of digital and analog functions can be integrated on configurable microprocessor supervisory device 10 for selection by NV registers 12–15.

Figure 2:
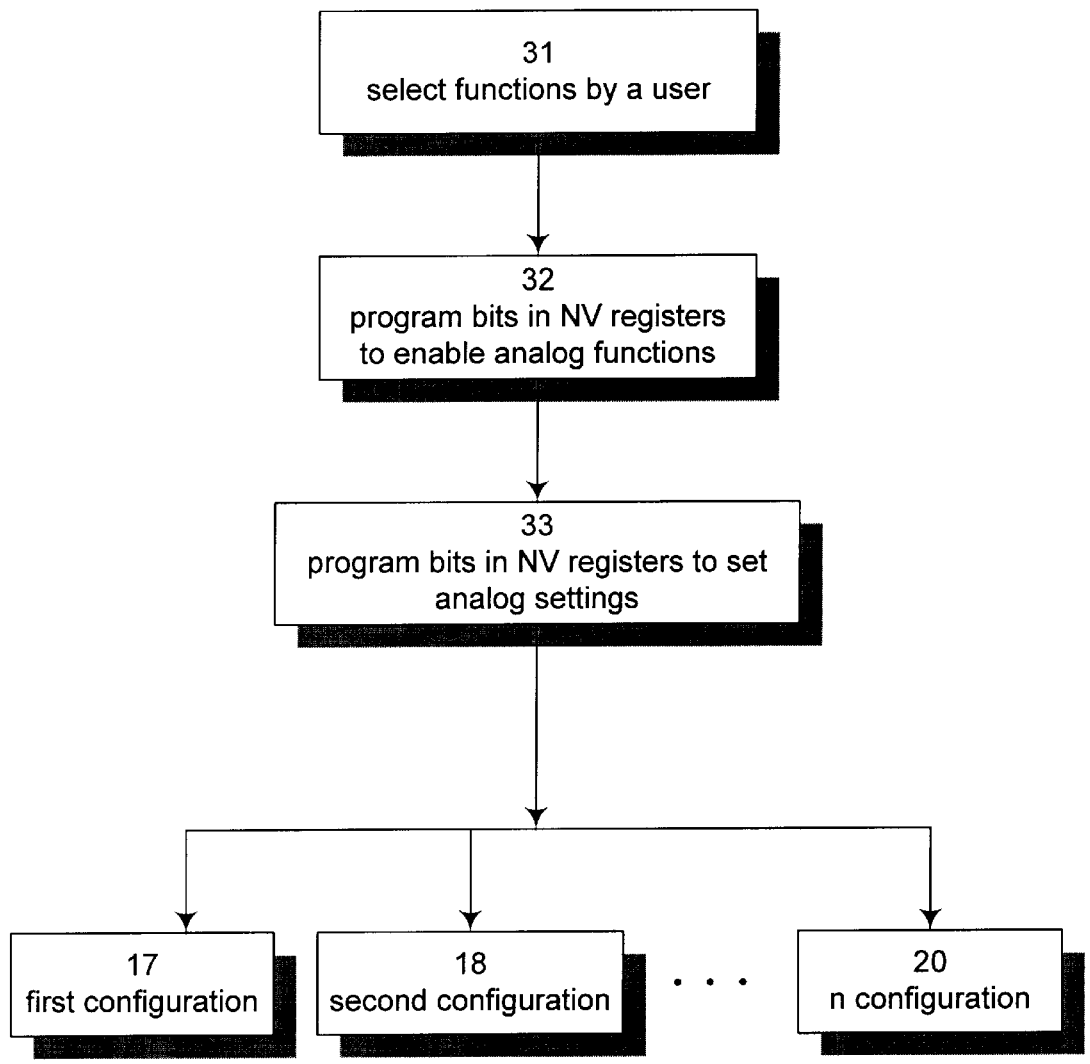
FIG. 2 is a flow chart illustrating the configurable microprocessor supervisory device with a nonvolatile memory in accordance with the present invention.

FIG. 2 is a flow chart of configurable microprocessor supervisory method 20 with non-volatile memory 11. A manufacturer or user selects 31 a certain combinations of analog functions and output levels for operation with a microprocessor (not shown). The combination of analog functions and output levels corresponds with first configuration 17, second configuration 18, third configuration 19, or n configuration 20. A manufacturer or user programs 32 certain nonvolatile bits in configuration registers 12, 13, 14, and 15 which correspond and enable the selected combinations of analog functions and output levels. An analog function or output level may have a range of settings. Optionally, when an analog function is enabled in step 32, the manufacturer or user programs 33 nonvolatile bits in configuration registers 12, 13, 14, and 15 to set a specific analog value associated with that enabled analog function. As a result of selecting the desirable combination of analog functions by programming configuration registers 12–15, first configuration 17, second configuration 18, third configuration 19, or n configuration 20 is generated on configurable microprocessor supervisory device 10.

FIGS. 3A–3D are table diagrams that illustrates one embodiment of configurable microprocessor supervisory device 10 with four configuration registers. Each NV registers corresponds to a specified byte, namely, configuration register 12 storing byte 0, configuration register 13 storing byte 1, configuration register 14 storing byte 2, and configuration register 15 storing byte 3.

FIG. 3A is a table diagram showing bit assignments of byte 0 of configuration register 12. The reset voltage range on configurable microprocessor supervisory device 10 is selected by programming bits 4-0 in byte 0. Depending on the binary value of $byte_0[4:0]$ in configuration register 12, a corresponding reset voltage is selected. More specifically, the reset voltage is set as follows: if $byte_0[4:0]$ is programmed with a binary value of "10000", "01000", "00100", "00010", and "00001", the reset voltage is set respectively to 4.625, 4.375, 2.9, 2.65, and 2.15 volts. The duration of a reset timeout on configurable microprocessor supervisory device 10 is programmable through the selection in bits 5 and 6 in byte 0. The reset timeout is set at 200 ms when $byte_0[6:5]$="11", set at 100 ms when $byte_0[6:5]$= 10, set at 50 ms when $byte_0[6:5]$="01", an 25 ms when $byte_0[6:5]$="00".

FIG. 3B is a table diagram showing the bit assignments of byte 1 of configuration register 13. Byte 1 contains NV bits for selecting write enable, $V_{sense}$ voltage, responding to all addresses, device identifier code, and watchdog interval.

The duration of a watchdog interval is programmable through bits 2-0 in byte 1. When $byte_1[2:0]$ is programmed as "111", "110", "101", "100", "011" in binary value, the corresponding watchdog interval is equal to 6.4 seconds, 3.2 seconds, 1.6 seconds, 0.8 second, and 0.4 seconds respectively. The watchdog timer is in an OFF state when $byte_1[2:0]$=00X. A device identifier code is selected by programming bit 3 in byte 1 such that the device is responds to "1011" if $byte_1[3]$ is programmed with a "1" and responds to "1010" if $byte_1[3]$ is programmed with a "0".

Bit 4 of byte 1 in configuration register 13 designates whether configurable microprocessor supervisory device 10 responds to all addresses or responds to pin addresses. Configurable microprocessor supervisory device 10 responds to all addresses if $byte_2[4]$="1" and responds to all pin addresses if $byte_2[4]$="0". Table 1 below further shows the designation of bit 4 for each of the eight parts in this embodiment. Bit 5 of byte 1 of configuration register 13 indicates whether $V_{sense}$ is undervoltage or overvoltage. $V_{sense}$ is undervoltage when $byte_2[5]$="1" while $V_{sense}$ is overvoltage when $byte_2[5]$="1". Bit 6 of byte 1 turns ON or OFF A complete configuration write enable signal. The write enable signal is disabled if $byte_2[6]$="1" and is enabled if $byte_2[6]$="0".

TABLE 1

| Part No. | Byte 1:bit 4 | Other Functions |
|---|---|---|
| Part 1 | Set low to respond to pin addresses. | Pin 7 has an internal pulldown on this pin. This pin may float or tie low. |
| Part 2 | Set high to respond to all addresses. If byte 1:bit 4 is set low, then the part responds to A1 on pin1 and A2 on pin 3. A0 is a don't care. | |
| Part 3 | Set high to respond to all addresses. If byte 1:bit 4 is set low, then the part will respond to A1 on pin1 and A2 on pin3. A0 is a don't care. | |
| Part 4 | Set high to respond to all addresses. If byte 1:bit4 is set low, then this part responds to A2 on pin3. A0 and A1 are don't care. | |
| Part 5 | Set high to respond to all addresses. | Both resets respond to Vcc low, RESETN_in, and $V_{SENSE}$ |
| Part 6 | Respond to all addresses regardless of the setting of byte 1:bit 4. | |
| Part 7 | Respond to all addresses regardless of the setting of byte 1:bit 4. | |
| Part 8 | Set low to respond to pin addresses. | |

FIG. 3C is a table diagram showing the bit assignments of byte 2 of configuration register 14. Byte 2 includes programmable bits for trimming the $V_{sense}$ voltage or bandgap, for trimming the frequency of an oscillator, or for selecting whether to utilize full or half memory capacity. The $V_{sense}$ voltage is trimmed by programming bits 3-0 of byte 2 of configuration register 14 where the $V_{sense}$ voltage is trimmed to a lower value if $byte_3[3:0]$="1111" while the $V_{sense}$ voltage is increased to a higher value if $byte_3[3:0]$="0000". The trimming of the $V_{sense}$ voltage can be an iterative process in which the voltage trimming is repeated until the desirable $V_{sense}$ voltage is attained. The allocation of full or half memory is programmable through bit 4 of byte 2. Full memory is utilized when $byte_3[4]$="1" and only half memory is utilized when $byte_3[4]$="0". In this illustration, although 4K or 16K represents a full memory while 2K or 8K represents half memory, one skilled in the art should recognize that the value of full or half memory capacity can be adjusted depending a designer's choice. The oscillator's frequency is trimmed by programming bits 7-5 in byte 2 in configuration register 14. The frequency of the oscillator is reduced if $byte_3[7\text{-}5]$="111". To increase the frequency of the oscillator, the value of $byte_3[7\text{-}5]$ is set to "000". Similarly, this process can be repeated to further decrease or increase the frequency setting of the oscillator until a desirable frequency is obtained.

FIG. 3D is a table diagram showing bit assignments of byte 3 of configuration register 15. Byte 3 includes programming bits for trimming a $V_{trip}$ voltage, for selecting a full or half memory, and for enabling a configuration write disable signal. The $V_{trip}$ voltage is trimmed by setting $byte_4[3{:}0]$="1111". To increase the $V_{trip}$ voltage, $byte_4[3{:}0]$ are set to "0000". This process can be repeated to further decrease or increase the $V_{trip}$ voltage until the desirable $V_{trip}$ voltage is reached. Bits 6-4 in byte 3 of configuration register 15 select full or half memory for a particular configuration. When $byte_4[6{:}4]$ "111", the full/half memory for a part 8 or an eighth configuration is selected. When $byte_4[6{:}4]$="110", the full/half memory for a part 7 or a seventh configuration is selected. When $byte_4[6{:}4]$="101", "100", "011", "010", "001", and "000", the full/half memory is respectively selected for a part 6 or a sixth configuration, a part 5 or a fifth configuration, a part 4 or a fourth configuration, a part 3 or third configuration 19, a part 2 or second configuration 18, and part 1 or first configuration 17. The configuration write disable signal is programmed through bit 7 in byte 3 of configuration register 15 where the configuration write enable is enabled if $byte_4[7]$="0" and the configuration write enable is disabled when $byte_4[7]$="1". Additional registers divided as trim registers and as configuration registers are illustrated in hexadecimal numbers in Appendixes A and B.

Figure 4:
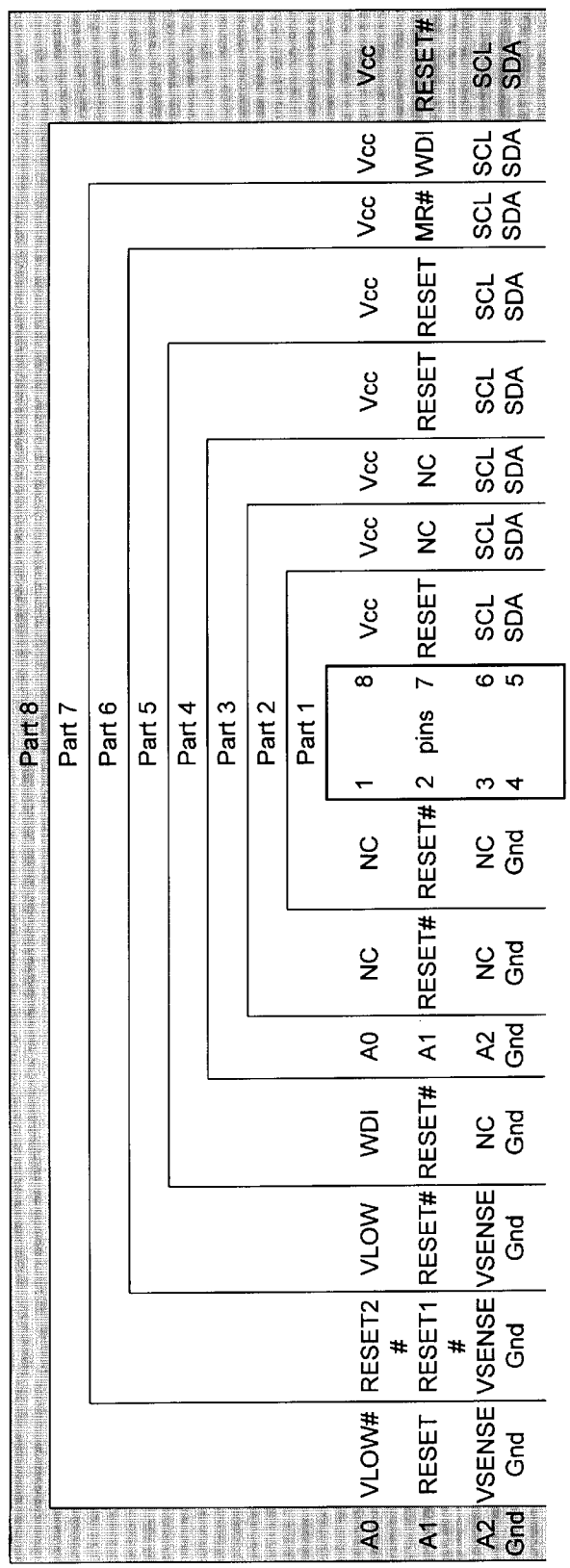
FIG. 4 is a diagram illustrating an alternate embodiment in a configurable microprocessor supervisory device for programming pin assignments in accordance with the present invention.

In an alternate embodiment, configuration registers in NV memory 11 are used to designate pin assignments. Configurable microprocessor supervisory device 10 is a configurable integrated circuit with eight pins which can be programmed to operate as one of the eight parts. The pin assignments for device 10 is configured as follows: if programmed as part 1, then pins 1 through 8 are assigned with pin 1 as NC, pin 2 as RESET#, pin 3 as NC, pin 4 as Gnd, pin 5 as SDA, pin 6 as SCL, pin 7 as RESET, and pin 8 as VCC; if programmed as part 2, then pins 1 through 8 are assigned with pin 1 as NC, pin 2 as RESET#, pin 3 as NC, pin 4 as Gnd, pin 5 as SDA, pin 6 as SCL, pin 7 as NC, and pin 8 as VCC; if programmed as part 3, then pins 1 through 8 are assigned with pin 1 as A0, pin 2 as A1, pin 3 as A2, pin 4 as Gnd, pin 5 as SDA, pin 6 as SCL, pin 7 as NC, and pin 8 as VCC; if programmed as part 4, then pins 1 through 8 are assigned with pin 1 as WDI, pin 2 as RESET#, pin 3 as NC, pin 4 as Gnd, pin 5 as SDA, pin 6 as SCL, pin 7 as RESET, and pin 8 as VCC; if programmed as part 5, then pins 1 through 8 are assigned with pin 1 as VLOW, pin 2 as RESET#, pin 3 as VSENSE, pin 4 as Gnd, pin 5 as SDA, pin 6 as SCL, pin 7 as RESET, and pin 8 as VCC; if programmed as part 6, then pins 1 through 8 are assigned with pin 1 as RESET#2, pin 2 as RESET#, pin 3 as VSENSE, pin 4 as Gnd, pin 5 as SDA, pin 6 as SCL, pin 7 as MR#, and pin 8 as VCC; if programmed as part 7, then pins 1 through 8 are assigned with VLOW#, pin 2 as RESET, pin 3 as VSENSE, pin 4 as Gnd, pin 5 as SDA, pin 6 as SCL, pin 7 as WDI, and pin 8 as VCC; if programmed as part 8, then pins 1 through 8 are assigned with pin 1 as A0, pin 2 as A1, pin 3 as A3, pin 4 as Gnd, pin 5 as SDA, pin 6 as SCL, pin 7 as RESET#, and pin 8 as VCC. Table 2 below further shows the pin assignments as described in FIG. 4.

TABLE 2

| Pin# | Part 8 | Part 7 | Part 6 | Part 5 | Part 4 | Part 3 | Part 2 | Part 1 |
|---|---|---|---|---|---|---|---|---|
| 1 | A0 | A1 | A1 | WDIB | RESETB1 | VLOWB | VLOWB | A0 |
| 2 | A1 | RESETB | RESETB | RESETB | RESETB2 | RESETB | RESETB | A1 |
| 3 | A2 | A2 | A2 | A2 | VSENSE | VSENSE | VSENSE | A2 |
| 4 | GND | GND | GND | GND | GND | GND | GND | GND |
| 5 | SDA | SDA | SDA | SDA | SDA | SDA | SDA | SDA |
| 6 | SCL | SCL | SCL | SCL | SCL | SCL | SCL | SCL |
| 7 | NC | NC/RESET | WP | RESET | RESETB_in | WDI | WDI | RESETB |
| 8 | VCC | VCC | VCC | VCC | VCC | VCC | VCC | VCC |

Various control settings and modifications of configuration registers 12–15 are within the spirit of the present invention. For example, configuration registers 12–15 can be set at the factory and then locked so that a user just receives a standard part and is not aware that the part is programmable. Or, two configuration registers 12 and 13 can be accessed by a user with the other two configuration registers 14 and 15 are locked. Or, all four configuration registers 12–15 can be accessed by the user and then locked if the user choose to trim analog functions and to select a device interface among multiple possible interfaces.

Figure 5:
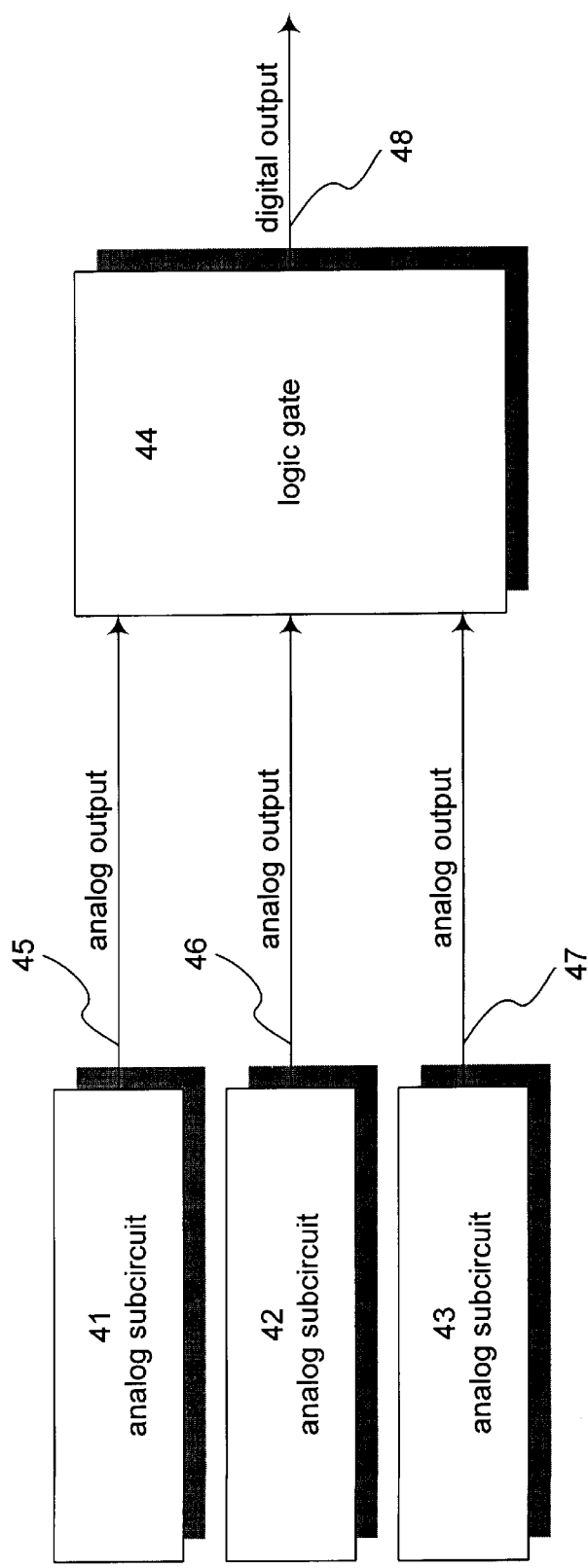
FIG. 5 is a block diagram in combining analog outputs to generate a digital output in accordance with the present invention.

FIG. 5 is a block diagram 40 in combining multiple analog outputs in generating a digital output. The block diagram 40 is integrated in configurable microprocessor supervisory device 10 and includes an analog subcircuit 41, an analog subcircuit 42, an analog subcircuit 43, and a logic gate 44. Logic gate 44, such as an OR gate or an AND gate, receives an analog output 45, an analog output 46, and an analog output 47 for generate a digital output 48. An example of digital output 48 is an interrupt request signal, IRQ#, which collects from various analog signals to produce the IRQ# signal.

The above embodiments are only illustrative of the principles of this invention and are not intended to limit the invention to the particular embodiments described. For example, it is apparent to one skilled in the art that non-volatile memory 11 can include as many configuration registers as needed to program various combinations of analog functions, digital functions, pin assignments, internal voltages, and external voltages. Moreover, one skilled in the art should recognize that a device configuration can be made dynamic such that an integrated circuit device can be re-configured during each power up or by the reception of an external control signal. Accordingly, various modifications, adaptations, and combinations of various features of the described embodiments can be practiced without departing from the scope of the invention as set forth in the appended claims.

APPENDIX A

Unpublished © 1999, Summit Microelectronics, Inc.

| Trim Register | Bit Assignments | Description |
|---|---|---|
| 0 | 7–4 | Not used |
|   | 3 | Configuration Write Disable |
|   |   | XXXX 1XXX Write Disable |
|   |   | XXXX 0XXX Write Enable |
|   | 2–0 | Oscillator Trim |
|   |   | XXXX X111 Slower |
|   |   | XXXX X000 Faster |
| 1 | 7–5 | Not Used |
|   | 4–0 | Slew Rate Trim |
|   |   | XXX1 1111 Faster |
|   |   | XXX0 0000 Slower |
| 2 | 7–4 | Temp Comp TIR Current Trim |
|   |   | 1111 XXXX Higher |
|   |   | 0000 XXXX Lower |
|   | 3–0 | Flat Across Temp Current Trim |
|   |   | XXXX 1111 Higher |
|   |   | XXXX 0000 Lower |
| 3 | 7–4 | Temp Comp Amp Gain Trim |
|   |   | 1111 XXXX Higher |
|   |   | 0000 XXXX Lower |
|   | 3–0 | Bandgap Trim |
|   |   | XXXX 1111 Lower |
|   |   | XXXX 0000 Higher |
| 4 | 7–0 | Temp Sense Amp Trim |
|   |   | 1111 1111 Higher |
|   |   | 0000 0000 Lower |
| 5 | 7–6 | CB_D Trip Adjustment |
|   |   | 11XX XXXX Higher |
|   |   | 00XX XXXX Lower |
|   | 5–4 | CB_C Trip Adjustment |
|   |   | XX11 XXXX Higher |
|   |   | XX00 XXXX Lower |
|   | 3–2 | CB_B Trip Adjustment |
|   |   | XXXX 11XX Higher |
|   |   | XXXX 00XX Lower |
|   | 1–0 | CB_A Trip Adjustment |
|   |   | XXXX XX11 Higher |
|   |   | XXXX XX00 Lower |
| 6 | 7–5 | Not Used |
|   | 4–0 | Tamp Offset Trim |
|   |   | XX11 1111 Higher |
|   |   | XX00 0000 Lower |
| 7 | 7–0 | Overvoltage/Undervoltage2 Current Trim |
|   |   | 1111 1111 Higher |
|   |   | 0000 0000 Lower |

APPENDIX B

Unpublished © 1999, Summit Microelectronics, Inc.

| Configuration Register | Bit Assignments | Description |
|---|---|---|
| 0 | 7–0 | Bus side A undervoltage trip point |
|   |   | 1111 1111 higher |
|   |   | 0000 0000 lower |
| 1 | 7–0 | Bus side B undervoltage trip point |
|   |   | 1111 1111 higher |
|   |   | 0000 0000 lower |
| 2 | 7–0 | Bus side C undervoltage trip point |
|   |   | 1111 1111 higher |
|   |   | 0000 0000 lower |
| 3 | 7–0 | Bus side D undervoltage trip point |
|   |   | 1111 1111 higher |
|   |   | 0000 0000 lower |
| 4 | 7 | Bus side A undervoltage enable |
|   |   | 1XXXX XXXX enable |
|   |   | 0XXXX XXXX disable |
|   | 6 | Bus side A overvoltage enable |
|   |   | X1XX XXXX enable |
|   |   | X0XX XXXX disable |
|   | 5–0 | Bus side A overvoltage offset |
|   |   | XX11 1111 higher |
|   |   | XX00 0000 lower |
| 5 | 7 | Bus side B undervoltage enable |
|   |   | 1XXXX XXXX enable |
|   |   | 0XXXX XXXX disable |
|   | 6 | Bus side B overvoltage enable |
|   |   | X1XX XXXX enable |
|   |   | X0XX XXXX disable |
|   | 5–0 | Bus side B overvoltage offset |
|   |   | XX11 1111 higher |
|   |   | XX00 0000 lower |
| 6 | 7 | Bus side C undervoltage enable |
|   |   | 1XXXX XXXX enable |
|   |   | 0XXXX XXXX disable |
|   | 6 | Bus side B overvoltage enable |
|   |   | X1XX XXXX enable |
|   |   | X0XX XXXX disable |
|   | 5–0 | Bus side B overvoltage offset |
|   |   | XX11 1111 higher |
|   |   | XX00 0000 lower |
| 7 | 7 | Bus side D undervoltage enable |
|   |   | 1XXXX XXXX enable |
|   |   | 0XXXX XXXX disable |
|   | 6 | Bus side B overvoltage enable |
|   |   | X1XX XXXX enable |
|   |   | X0XX XXXX disable |
|   | 5–0 | Bus side B overvoltage offset |
|   |   | XX11 1111 higher |
|   |   | XX00 0000 lower |
| 8 | 7–0 | Card side A undervoltage trip point |
|   |   | 1111 1111 higher |
|   |   | 0000 0000 lower |
| 9 | 7–0 | Card side B undervoltage trip point |
|   |   | 1111 1111 higher |
|   |   | 0000 0000 lower |
| A | 7–0 | Card side C undervoltage trip point |
|   |   | 1111 1111 higher |
|   |   | 0000 0000 lower |
| B | 7–0 | Card side D undervoltage trip point |
|   |   | 1111 1111 higher |
|   |   | 0000 0000 lower |
| C | 7 | Not used |
|   | 6 | Soft start enable supply A |
|   |   | X1XX XXXX enable |
|   |   | X0XX XXXX disable |
|   | 5–0 | Card side A overvoltage offset |
|   |   | XX11 1111 higher |
|   |   | XX00 0000 lower |
| D | 7 | Not used |
|   | 6 | Soft start enable supply B |
|   |   | X1XX XXXX enable |
|   |   | X0XX XXXX disable |

APPENDIX B-continued

Unpublished © 1999, Summit Microelectronics, Inc.

| Configuration Register | Bit Assignments | Description |
|---|---|---|
| | 5–0 | Card side A overvoltage offset<br>XX11 1111 higher<br>XX00 0000 lower |
| E | 7 | Not used |
| | 6 | Soft start enable supply C<br>X1XX XXXX enable<br>X0XX XXXX disable |
| | 5–0 | Card side A overvoltage offset<br>XX11 1111 higher<br>XX00 0000 lower |
| F | 7 | Not used |
| | 6 | Soft start enable supply D<br>X1XX XXXX enable<br>X0XX XXXX disable |
| | 5–0 | Card side A overvoltage offset<br>XX11 1111 higher<br>XX00 0000 lower |
| 10 | 7 | Responds to all addresses<br>1XXX XXXX respond to all addresses<br>0XXX XXXX respond to pin addresses |
| | 6 | Change device identifier code<br>X1XX XXXX respond to 1011<br>X0XX XXXX respond to 1010 |
| | 5–4 | Tracker over/under 300mv action<br>XX11 XXXX generate IRQ<br>XX10 XXXX shut down all<br>XX01 XXXX shut down bad channel<br>XX00 XXXX do nothing |
| | 3–2 | Tracker slew rate rising<br>XXXX 11XX 1000 v/s<br>XXXX 10XX 500 v/s<br>XXXX 01XX 250 v/s<br>XXXX 00XX 100 v/s |
| | 1–0 | Tracker slew rate falling<br>XXXX 11XX 1000 v/s<br>XXXX 10XX 500 v/s<br>XXXX 01XX 250 v/s<br>XXXX 00XX 100 v/s |
| 11 | 7 | Bus side A undervoltage<br>1XXX XXXX triggers reset<br>0XXX XXXX does not trigger reset |
| | 6 | Bus side B undervoltage<br>X1XX XXXX triggers reset<br>X0XX XXXX does not trigger reset |
| | 5 | Bus side C undervoltage<br>XX1X XXXX triggers reset<br>XX0X XXXX does not trigger reset |
| | 4 | Bus side D undervoltage<br>XXX1 XXXX triggers reset<br>XXX0 XXXX does not trigger reset |
| | 3 | Bus side A overvoltage<br>XXXX 1XXX triggers reset<br>XXXX 0XXX does not trigger reset |
| | 2 | Bus side B overvoltage<br>XXXX X1XX triggers reset<br>XXXX X0XX does not trigger reset |
| | 1 | Bus side C overvoltage<br>XXXX XX1X triggers reset<br>XXXX XX0X does not trigger reset |
| | 0 | Bus side D overvoltage<br>XXXX XXX1 triggers reset<br>XXXX XXX0 does not trigger reset |
| 12 | 7 | Card side A undervoltage<br>1XXX XXXX triggers reset<br>0XXX XXXX does not trigger reset |
| | 6 | Card side B undervoltage<br>X1XX XXXX triggers reset<br>X0XX XXXX does not trigger reset |
| | 5 | Card side C undervoltage<br>XX1X XXXX triggers reset<br>XX0X XXXX does not trigger reset |
| | 4 | Card side D undervoltage<br>XXX1 XXXX triggers reset<br>XXX0 XXXX does not trigger reset |
| | 3 | Card side A undervoltage#2<br>XXXX 1XXX triggers reset<br>XXXX 0XXX does not trigger reset |
| | 2 | Card side B undervoltage#2<br>XXXX X1XX triggers reset<br>XXXX X0XX does not trigger reset |
| | 1 | Card side C undervoltage#2<br>XXXX XX1X triggers reset<br>XXXX XX0X does not trigger reset |
| | 0 | Card side D undervoltage#2<br>XXXX XXX1 triggers reset<br>XXXX XXX0 does not trigger reset |
| 13 | 7 | Bus side A undervoltage<br>1XXX XXXX triggers IRQ#<br>0XXX XXXX does not trigger IRQ# |
| | 6 | Bus side B undervoltage<br>X1XX XXXX triggers IRQ#<br>X0XX XXXX does not trigger IRQ# |
| | 5 | Bus side C undervoltage<br>XX1X XXXX triggers IRQ#<br>XX0X XXXX does not trigger IRQ# |
| | 4 | Bus side D undervoltage<br>XXX1 XXXX triggers IRQ#<br>XXX0 XXXX does not trigger IRQ# |
| | 3 | Bus side A overvoltage<br>XXXX 1XXX triggers IRQ#<br>XXXX 0XXX does not trigger IRQ# |
| | 2 | Bus side B overvoltage<br>XXXX X1XX triggers IRQ#<br>XXXX X0XX does not trigger IRQ# |
| | 1 | Bus side C overvoltage<br>XXXX XX1X triggers IRQ#<br>XXXX XX0X does not trigger IRQ# |
| | 0 | Bus side D overvoltage<br>XXXX XXX1 triggers IRQ#<br>XXXX XXX0 does not trigger IRQ# |
| 14 | 7 | Card side A undervoltage<br>1XXX XXXX triggers IRQ#<br>0XXX XXXX does not trigger IRQ# |
| | 6 | Card side B undervoltage<br>X1XX XXXX triggers IRQ#<br>X0XX XXXX does not trigger IRQ# |
| | 5 | Card side C undervoltage<br>XX1X XXXX triggers IRQ#<br>XX0X XXXX does not trigger IRQ# |
| | 4 | Card side D undervoltage<br>XXX1 XXXX triggers IRQ#<br>XXX0 XXXX does not trigger IRQ# |
| | 3 | Card side A undervoltage#2<br>XXXX 1XXX triggers IRQ#<br>XXXX 0XXX does not trigger IRQ# |
| | 2 | Card side B undervoltage#2<br>XXXX X1XX triggers IRQ#<br>XXXX X0XX does not trigger IRQ# |
| | 1 | Card side C undervoltage#2<br>XXXX XX1X triggers IRQ#<br>XXXX XX0X does not trigger IRQ# |
| | 0 | Card side D undervoltage#2<br>XXXX XXX1 triggers IRQ#<br>XXXX XXX0 does not trigger IRQ# |
| 15 | 7 | Bus side A undervoltage IRQ# fault (volatile)<br>1XXX XXXX fault<br>0XXX XXXX no fault |
| | 6 | Bus side B undervoltage IRQ# fault (volatile)<br>X1XX XXXX fault<br>X0XX XXXX no fault |
| | 5 | Bus side C undervoltage IRQ# fault (volatile)<br>XX1X XXXX fault<br>XX0X XXXX no fault |

APPENDIX B-continued

Unpublished © 1999, Summit Microelectronics, Inc.

| Configuration Register | Bit Assignments | Description |
|---|---|---|
| | 4 | Bus side D undervoltage IRQ# fault (volatile)<br>XXX1 XXXX fault<br>XXX0 XXXX no fault |
| | 3 | Bus side A overvoltage IRQ# fault (volatile)<br>XXXX 1XXX fault<br>XXXX 0XXX no fault |
| | 2 | Bus side B overvoltage IRQ# fault (volatile)<br>XXXX X1XX fault<br>XXXX X0XX no fault |
| | 1 | Bus side C overvoltage IRQ# fault (volatile)<br>XXXX XX1X fault<br>XXXX XX0X no fault |
| | 0 | Bus side D overvoltage IRQ# fault (volatile)<br>XXXX XXX1 fault<br>XXXX XXX0 no fault |
| 16 | 7 | Card side A undervoltage IRQ# fault (volatile)<br>1XXX XXXX fault<br>0XXX XXXX no fault |
| | 6 | Card side B undervoltage IRQ# fault (volatile)<br>X1XX XXXX fault<br>X0XX XXXX no fault |
| | 5 | Card side C undervoltage IRQ# fault (volatile)<br>XX1X XXXX fault<br>XX0X XXXX no fault |
| | 4 | Card side D undervoltage IRQ# fault (volatile)<br>XXX1 XXXX fault<br>XXX0 XXXX no fault |
| | 3 | Card side A overvoltage IRQ# fault (volatile)<br>XXXX 1XXX fault<br>XXXX 0XXX no fault |
| | 2 | Card side B overvoltage IRQ# fault (volatile)<br>XXXX X1XX fault<br>XXXX X0XX no fault |
| | 1 | Card side C overvoltage IRQ# fault (volatile)<br>XXXX XX1X fault<br>XXXX XX0X no fault |
| | 0 | Card side D overvoltage IRQ# fault (volatile)<br>XXXX XXX1 fault<br>XXXX XXX0 no fault |
| 17 | 7–6<br>5–3 | Unused<br>Longdog<br>XX11 1XXX 6.4ms<br>XX11 0XXX 3.2ms<br>XX10 1XXX 1.6ms<br>XX10 0XXX 0.8ms<br>XX0X XXXX off |
| | 2–0 | XXXX X111 3.2s<br>XXXX X110 1.6s<br>XXXX X101 0.8s<br>XXXX X100 0.4s<br>XXXX X0XX off |

We claim:

1. A method for programming a configurable integrated circuit, comprising the steps of:

programming a plurality of nonvolatile bits in one or more nonvolatile registers, each nonvolatile bit or a combination of nonvolatile bits in the plurality of nonvolatile bits corresponding to an analog function; and generating a configuration on an integrated circuit from programming the plurality of nonvolatile bits in the one or more nonvolatile registers.

2. The method of claim 1 wherein the plurality of nonvolatile bits in the one or more nonvolatile registers comprises $E^2$ cells.

3. The method of claim 1 wherein in the programming step comprises the step of enabling an analog function by the nonvolatile bit or the combination of nonvolatile bits.

4. The method of claim 3 wherein in the enabling step comprises the step of setting the analog function to a specific value.

5. The method of claim 1 wherein in the programming step comprises changing pin assignments by programming one or more nonvolatile bits.

6. The method of claim 1 wherein the analog function comprises trimming an internal voltage of the integrated circuit.

7. The method of claim 1 further comprising the step of combining a plurality of analog signals to generate a digital output.

8. The method of claim 1 further comprising the step of storing a status of a fault condition of the integrated circuit in the one or more NV registers.

9. An integrated circuit, comprising:

one or more nonvolatile registers having a plurality of nonvolatile bits, each nonvolatile bit or a combination of nonvolatile bits in the plurality of nonvolatile bits corresponding to programming an analog function; and a circuit configuration in the integrated circuit being generated from programming one or more nonvolatile registers.

10. The integrated circuit of claim 9 further comprising a decoder, coupled between the one or more nonvolatile registers and a circuit configuration, for decoding the plurality of nonvolatile bits for programming analog functions.

11. The integrated circuit of claim 9 wherein the plurality of nonvolatile bits comprises $E^2$ cells.

12. The integrated circuit of claim 9 wherein the nonvolatile bit or the combination of nonvolatile bits in the one or more nonvolatile registers enables the analog function.

13. The integrated circuit of claim 12 wherein the nonvolatile bit or the combination of nonvolatile bits in the one or more nonvolatile registers sets a specific value to the enabled analog function.

14. The integrated circuit of claim 9 wherein the nonvolatile bit or the combination of nonvolatile bits in the one or more nonvolatile registers changes pin assignments of the integrated circuit.

15. The integrated circuit of claim 12 where the bit or the combination of nonvolatile bits trims an internal voltage of the enabled analog function.

16. The integrated circuit of claim 9 further comprising a logic gate for combining a plurality of analog signals to generate a digital output.

17. A configurable device, comprising:

means for programming one or more nonvolatile registers having a plurality of nonvolatile bits, each bit or a combination of bits in the plurality of nonvolatile bits corresponding to an analog function; and means for generating a configuration from programming the plurality of nonvolatile bits.

18. The configurable device of claim 17 wherein the programming means of the one or more nonvolatile registers comprises $E^2$ cells.

19. The configurable device of claim 17 wherein the programming means comprises enabling the analog function.

20. The configurable device of claim 17 wherein the programming means comprises selecting a specific value of the analog function.

* * * * *